United States Patent [19]
Kelley

[11] 3,842,371
[45] Oct. 15, 1974

[54] VOLTAGE TO FREQUENCY CONVERTER

[75] Inventor: Thomas P. Kelley, Cornwells Heights, Pa.

[73] Assignee: Honeywell Inc., Minneapolis, Minn.

[22] Filed: Oct. 12, 1973

[21] Appl. No.: 405,811

[52] U.S. Cl. .......... 331/143, 331/177 R
[51] Int. Cl. .......... H03k 3/02
[58] Field of Search..... 331/111, 108 D, 143, 177 R

[56] References Cited

UNITED STATES PATENTS

| | | | |
|---|---|---|---|
| 3,376,518 | 4/1968 | Emmer | 331/111 |
| 3,422,372 | 1/1969 | Post et al. | 331/111 X |
| 3,621,469 | 11/1971 | Bauer | 331/111 |
| 3,742,379 | 6/1973 | McLean | 331/111 |

*Primary Examiner*—Herman Karl Saalbach
*Assistant Examiner*—Siegfried H. Grimm
*Attorney, Agent, or Firm*—Arthur H. Swanson; Lockwood D. Burton

[57] ABSTRACT

A voltage to frequency converter includes an integrating ramp generator the output of which is compared with a reference signal to produce an output pulse whenever the magnitude of the ramp signal reaches equality with the reference signal. The output signal is coupled back through a switching circuit to reset the integrating ramp generator each time an output pulse is produced. The slope of the ramp being a function of the magnitude of the input signal applied to the ramp generator, the frequency of the output pulses will be proportional to the magnitude of the applied input signal. In order to accomplish a relatively high frequency of output pulses without unduly increasing the frequency of the switching operation, a plurality of comparators are provided, each connected directly to the output of the ramp generator and each comparing the ramp signal with a different reference signal level. A pulse signal generator is connected to the output of each of the comparators to produce a pulse whenever the associated comparator recognizes an equality between the ramp signal and its unique reference signal. The output of the several pulse generators are coupled through an OR gate to an output circuit. The output pulse from the pulse generator coupled to the comparator to which the highest reference signal is applied is the only one coupled back to operate the switching circuit to reset the ramp generator.

7 Claims, 2 Drawing Figures

VOLTAGE TO FREQUENCY CONVERTER

BACKGROUND OF THE INVENTION

1. Field of the Invention

The present invention relates to an electronic control circuit, and more particularly to a voltage to frequency converter. Such voltage to frequency converters are generally classified in the United States Patent Office Class 331-Oscillators, sub class 111 Solid State, relaxation; and sub class 143-relaxation.

2. Description of the Prior Art

In the art of industrial process control, various parameters of a system under control or under analysis are measured in terms of their analog values. It has also been found desirable to use modern digital computers in connection with both analytical and control instruments in industrial processes. Accordingly, it becomes necessary to convert the analog values of the measured parameters into digital values which may be accepted by the accompanying digital computer. One approach to effecting the analog to digital conversion is to first convert the analog signal into a frequency signal with the resulting frequency being proportional to the value of the analog signal. Heretofore, many forms of apparatus have been provided for accomplishing, in one way or another, a voltage to frequency conversion. Typical of such prior art apparatus is Bahrs et al U.S. Pat. Nos. 3,022,469; James 3,482,116; Winn 3,419,784; Ammamm 3,316,547; Gilbert 3,051,939; and Suran 2,826,696. While the foregoing list of patents is by no means exhaustive, it is representative of the previous efforts made by others for providing a voltage to frequency conversion. Among the deficiencies found in the previous apparatus is nonlinearity of the relationship of the voltage to frequency, a limited range of output frequencies and/or undue complexity in structure.

SUMMARY OF THE INVENTION

It is, accordingly, an object of the present invention to provide an improved voltage to frequency converter.

It is another object of the present invention to provide an improved voltage to frequency converter which is structurally relatively simple.

It is a further object of the present invention to provide an improved voltage to frequency converter as set forth and which features a linear response characteristic over a wide range of output frequencies.

In accomplishing these and other objects there has been provided, in accordance with the present invention, a voltage to frequency converter which includes an integrating ramp generator for producing a ramp output signal the slope of which is proportional to the magnitude of applied input signal. The ramp output signal is compared with one or more reference signals to produce an output pulse on the occurrence of coincidence of the ramp signal with each of the reference signals, that is, whenever the ramp signal is equal to or greater than the reference signal. The output pulses are combined to produce a composite train of output pulses. The pulse corresponding to the highest level reference signal is also applied in a feedback manner to reset the integrating ramp generator on the occurrence of that pulse.

DESCRIPTION OF AN EMBODIMENT OF THE INVENTION

Figure 1:
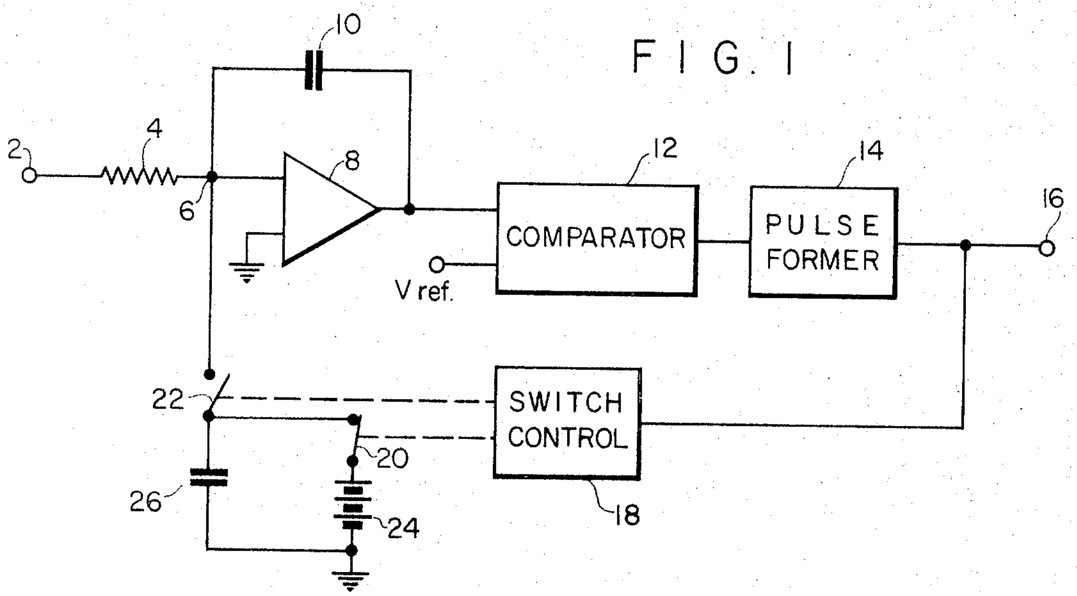
FIG. 1 is a schematic representation of a voltage to frequency converter illustrating the basic features of the present invention.

In FIG. 1 there is shown a circuit embodying a basic form of a voltage to frequency converter according to the present invention in which an input signal representing some analog value is applied to an input terminal 2. The input terminal 2 is connected through an input resistor 4 to a summing junction 6 at one input terminal of an integrating amplifier 8. The output of the amplifier 8 is connected through an integrating or feedback capacitor 10 to the summing junction 6. The output of the amplifier 8 is also connected to one input terminal of a voltage comparator 12 of conventional design. The other input terminal of the comparator 12 is connected to a predetermined voltage reference indicated as V ref. The nature of the comparator 12 is such that whenever the output signal from the integrating amplifier reaches equality with the voltage reference source, the output signal from the comparator 12 changes from one voltage level state to a significantly different voltage level state.

Such output signal from the comparator 12 is applied as an input signal to a pulse former 14. The pulse former 14 may be a simple differentiator circuit or it may be in the form of a one-shot multi-vibrator. In either event, the output signal from the pulse former 14 is a single pulse of energy whenever the output signal from the comparator changes from a low to a high state.

The output pulse signal from the pulse former 14 is applied directly to an output terminal 16. The output pulse signal from the pulse former 14 is also applied to control the operation of a switch control circuit 18. The switch control circuit 18 controls the operation of a pair of switches 20 and 22. While the switches 20 and 22 have been illustrated as being mechanical switches it will be understood that they may well be, and preferably are, electronic switch means such as transistor switches. When the switch 20 is closed there is completed a circuit from a battery 24 through a capacitor 26. The common terminal of the battery 24 and capacitor 26 is connected to ground, as shown. The battery 24 is, of course, representative of any suitably polarized d.c. voltage source. The conditions of the switches 20 and 22 are arranged to be alternately reversed. That is, when the switch 20 is closed the switch 22 is opened and, conversely, when the switch 22 is closed the switch 20 is opened. When the switch 20 is open and the switch 22 is closed the capacitor 26 is connected between the summing junction 6 and ground.

OPERATION OF THE CIRCUIT OF FIG. 1

For purposes of illustration, it is assumed that the input signal applied to the terminal 2 is a negative signal with respect to ground. The negative signal applied to the input of the integrating amplifier 8 causes an increasing ramp signal to appear at the output terminal thereof. For fixed values of the integrating network, the slope of the ramp will be a function of the magnitude of the signal applied to the input terminal 2. That ramp signal is applied to one of the input terminals of the comparator 12 where it is compared with the voltage reference V ref. applied to the other input terminal of the comparator 12. As the ramp signal reaches equality with the reference signal, the output of comparator 12 changes state to produce an intermediate signal indicative of that equality, which signal is applied to the pulse former 14. The pulse former then produces a pulse, as hereinbefore mentioned, to the output terminal 16.

During the time that the ramp signal is being developed by the integrator up to the level of the voltage reference applied to the comparator 12, the switches 20 and 22 have been in the position shown with the switch 20 closed and the switch 22 open. In this condition, the capacitor 26 will have been charged to the potential of the power supply or battery 24. It will be noted that the charge on the capacitor 26 is of opposite polarity with respect to the polarity of the voltage appearing at the summing junction 6. Thus, when the output pulse from the pulse former 24 actuates the switch control circuit 18, the position of the switches 20 and 22 are reversed, that is, the switch 20 opens and the switch 22 closes. The closure of the switch 22 applies the charge on the capacitor 26 to the summing junction 6 in opposition to the charge on the capacitor 10. While the closure of the switch 22 is relatively momentary, it is sufficient to effectively reset the integrator to a starting condition and thereby reset the comparator to its initial condition.

As soon as the switch 22 has been reopened, the integrator again begins to produce a ramp signal which, as before, is a function of the magnitude of the input signal applied to the input terminal 2. The cycle is repeated producing another output pulse. Since the slope of the ramp signal is a function of the magnitude of the input signal, the rapidity with which the second pulse follows the first pulse is also a function of the magnitude of the input signal. Thus, the frequency of the output pulses appearing at the output terminal 16 is in direct relationship to the magnitude of the analog signal applied to the input terminal 2.

DETAILED DESCRIPTION OF A PREFERRED EMBODIMENT OF THE INVENTION

While the voltage to frequency converter illustrated in FIG. 1 provides a reliable conversion, there is an upper limit to the output frequency as determined by the maximum frequency at which the switches 20 and 22 and the amplifier 8 may be actuated reliably and without introducing a frequency related nonlinearity in the overall operation. Accordingly, in FIG. 2 there is illustrated a voltage to frequency converter which is not so limited.

Figure 2:
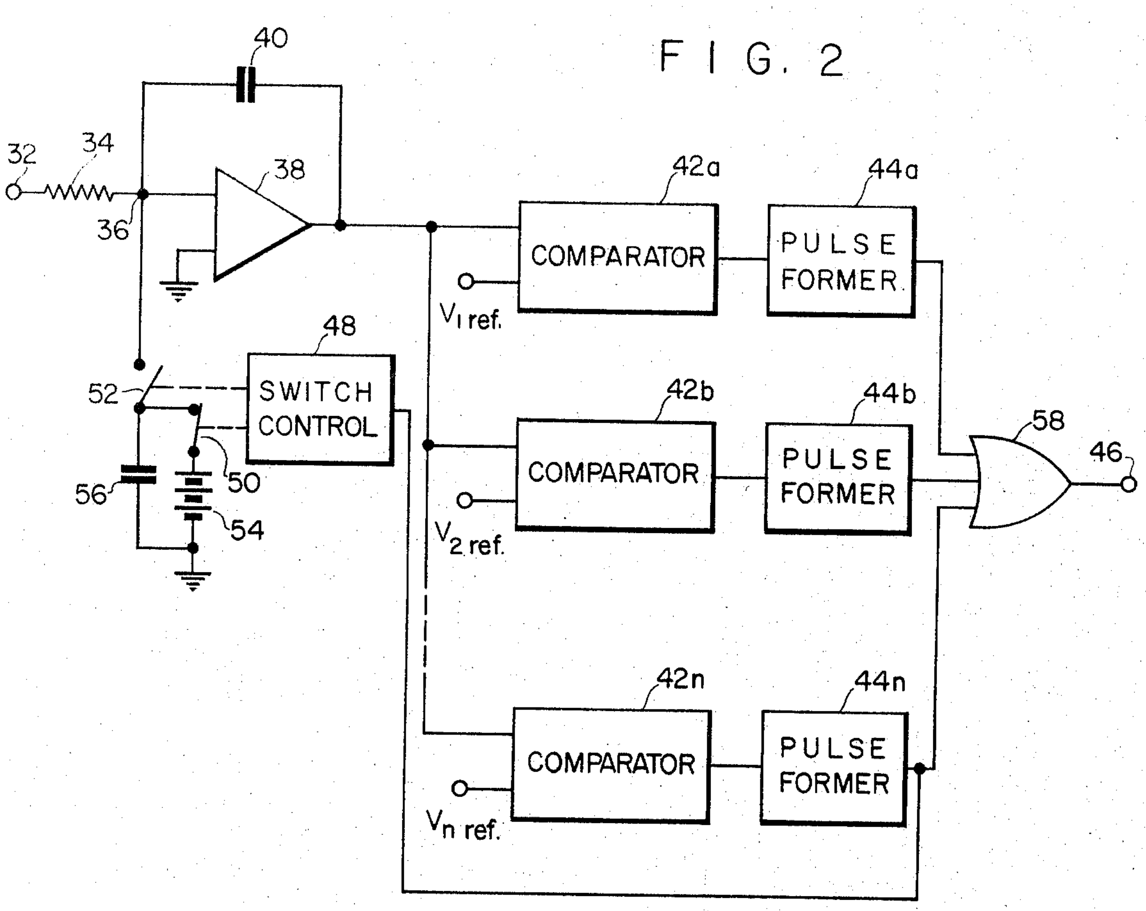
FIG. 2 is a schematic diagram of a wide range voltage to frequency converter embodying the present invention.

There is provided in FIG. 2 an integrator or ramp generator which is identical to that shown in FIG. 1. An input signal is applied to an input terminal 32. The input terminal 32 is connected through an input resistor 34 to a summing junction 36 at one input terminal of an integrating amplifier 38. The output of the amplifier 38 is connected through an integrating or feedback capacitor 40 to the summing junction 36. The output of the amplifier 38 is also connected in parallel to one input terminal of each of a plurality of comparators 42*a*, 42*b* . . . 42*n*. The other input terminal of each of the comparators is connected to a unique voltage reference VI ref., V2 ref. . . . , Vn ref., as will be discussed more fully hereinafter. Again, as in the circuit of FIG. 1, the comparators are of conventional design and are substantially identical to the one shown in FIG. 1. The output signals form each of the comparators are applied as input signals to corresponding pulse formers 44*a*, 44*b* . . . 44*n*. The voltage reference signals applied to the second terminals of each of the comparators 42*a* through 42*n* are of progressively increasing magnitude starting with a lowest reference voltage of V*l* ref. through a highest reference voltage of V*n* ref. Preferably, the reference voltages are uniformly distributed over the range between V*l* and V*n*.

The output pulse from the pulse former 44*n*, representing the highest level reference voltage, is applied as input signal to a switch control circuit 48 which is, in all respects, identical to the switch control circuit 18 of FIG. 1. The switch control circuit 48 controls a pair of switches 50 and 52. The switch 50 when closed, connects a battery 54 across a grounded capacitor 56. As before, the switches 50 and 52 are alternately reversed upon actuation of the switch control circuit 48. When the switch 50 is opened, the switch 52 is closed to connect the capacitor 56 between the summing junction 36 and ground.

The output pulses from each of the several pulse formers 44*a* through 44*n* is applied as input signal to a separate one of several input terminals of an OR gate 58. The output terminal of the OR gate 58 is connected to an output terminal 46.

OPERATION OF THE PREFERRED EMBODIMENT

The operation of the integrator or ramp generator of the circuit shown in FIG. 2 together with the operation of the associated switches 50 and 52 is identical with that of the circuit shown in FIG. 1. The output signal from the integrator is a ramp signal the slope of which is a function of the magnitude of the input signal applied to the input terminal 32. That ramp signal is applied simultaneously, in parallel, to one of the input terminals of each of the several comparators 42*a*, 42*b* . . . 42*n*.

As the increasing ramp signal reaches a point of equality with the first of the voltage reference signals V*l* ref., the first comparator 42*a* is actuated to a change of state producing an output pulse, by way of the pulse former 42*a*, to one of the input terminals of the OR gate 58. A positive signal at any one of the input terminals of the OR gate 58 produces a corresponding output pulse at the output terminal 46. Therefore, a first pulse is produced when the ramp signal reaches equality with the lowest of the reference voltages V*l* ref.

As the ramp signal continues to increase to the level of the second voltage reference signal V2 ref., the second comparator 42*b* is actuated to produce an output pulse through the pulse former 44*b* to a second input terminal of the OR gate 58. This, in turn, produces a second output signal at the output terminal 46. As the ramp signal continues to increase, successive comparators will produce corresponding output signals through the corresponding pulse formers to the several input terminals of the OR gate 58 and hence to the output terminal 46.

When the ramp signal reaches equality with the highest valued reference signal V*n* ref., the last of the comparators 42*n* is activated to produce an output pulse through the pulse former 44*n* to the remaining input terminal of the OR gate 58 hence to the output terminal 46. The output pulse from the pulse former 44*n* is also applied as control signal to the switch control circuit 48 to actuate the switches 50 and 52 in the same manner as the actuation of the switches 20 and 22 described in connection with the circuit of FIG. 1.

Again, with the switch 50 closed, the capacitor 56 is charged to the potential of the power supply or battery 54. Upon reversal of the switches 50 and 52, that is, when switch 50 is opened and switch 52 is closed, the charge on the capacitor 56 is applied in opposition to the charge on the capacitor 40 at the summing junction 36. This, effectively, resets the integrator and a new cycle begins.

While the operation of the circuit of FIG. 2 is basically identical to the operation of the circuit of FIG. 1, there is a significant difference. Whereas in the circuit of FIG. 1 a single output pulse was produced at the output terminal 16 for each ramp signal produced at the output of the integrator, in the circuit of FIG. 2, a plurality of output pulses appear at the output terminal 46 for each ramp signal generated by the integrator. The number of pulses produced during the excursion of each ramp corresponds to the number of comparators included in the system. With this arrangement a significantly higher frequency of output pulses may be accomplished without exceeding the switching capabilities of the resetting switches 50 and 52 or the recycling capabilities of the amplifier 38. Whereas the switch control circuit 48 and the accompanying switches 50 and 52 are actuated once for each ramp signal output from the integrator amplifier 38, the output pulse frequency at the output terminal 46 is the repetition frequency of the ramp signal multiplied by the number of comparator and pulse former circuits.

Thus, it may be seen that there has been provided, in accordance with the present invention, an improved voltage to ferquency conversion means which features the capability for a wide range frequency output without introducing a frequency related nonlinearity in the output signal.

The embodiments of the invention in which an exclusive property or privilege is claimed are defined as follows:

1. A voltage to frequency converter comprising a ramp signal generator for producing a ramp signal the slope of which is a function of the magnitude of an input voltage signal;

a signal comparator connected to said ramp signal generator for comparing said ramp signal with a predetermined reference signal, said comparator being operative to produce an intermediate signal on the occurrence of equality between said ramp signal and said reference signal;

a pulse former connected to said comparator and responsive to said intermediate signal to produce an output pulse on the occurrence of each such intermediate signal;

a ramp signal generator resetting capacitor, means for charging said resetting capacitor to a predetermined charge;

switch means operable in response to said output pulse for connecting said resetting capacitor to said ramp signal generator to reset said ramp signal generator.

2. A voltage to frequency converter comprising a ramp signal generator for producing a ramp signal the slope of which is a function of the magnitude of an input voltage signal;

a plurality of signal comparators connected in parallel to the output of said ramp signal generator for comparing said ramp signal with each of a plurality of reference signals, said comparators being operative to produce an intermediate signal on the occurrence of equality between said ramp signal and each of said reference signals;

a plurality of pulse formers, one connected to each of said comparators and responsive to said intermediate signals to produce output pulse signals on the occurrence of each of said intermediate signals; and resetting means coupled to the one of said pulse formers corresponding to the reference signal of greatest magnitude for resetting said ramp signal generator on the occurrence of an output pulse from said last mentioned pulse former.

3. A voltage to frequency converter as set forth in claim 2 and including combining means coupled to all of said pulse formers to produce a composite output signal comprising the pulse output signals from all of said pulse formers.

4. A voltage to frequency converter as set forth in claim 3 wherein said combining means comprises an OR gate.

5. A voltage to frequency converter as set forth in claim 2 wherein said resetting means comprises a capacitor, means for charging said capacitor to a predetermined charge, and switching means operable in response to an output pulse from said one of said pulse formers to connect said capacitor to said ramp signal generator to effect a resetting thereof.

6. A voltage to frequency converter comprising a ramp signal generator for producing a ramp signal the slope of which is a function of the magnitude of an input voltage signal;

said ramp signal generator including an integrating amplifier having a summing junction at one input terminal thereof;

a plurality of signal comparators connected in parallel to the output terminal of said ramp signal generator for comparing said ramp signal with each of a plurality of reference signals, said reference signals being of progressively different values with respect to each other, said comparators being operative to produce an intermediate signal on the occurrence of equality between said ramp signal and each of said reference signals;

a plurality of pulse formers, one connected to each of said comparators, responsive to said intermediate signals to produce output pulse signals on the occurrence of each of said intermediate signals;

OR gate means connected to the outputs of all of said pulse formers to produce a composite train of output pulses corresponding to the output pulse signals from all of said pulse formers;

a ramp signal generator resetting capacitor having one terminal connected to ground;

means for charging said resetting capacitor to a predetermined charge;

switch means connected to the other terminal of said resetting capacitor for alternately connecting said other terminal of said capacitor to said charging means and to said summing junction;

switch control means connected to the output of the one of said pulse formers corresponding to the comparator to which the largest reference signal is applied, said switch control means being responsive to the output pulse from said one of said pulse formers to actuate said switch means to transfer the connection of said resetting capacitor from said charging means to said summing junction on the occurrence of said output pulse corresponding to the comparison of said ramp signal with the largest of said reference signals whereby to reset said ramp signal generator in response to said output pulse from said one of said pulse formers.

7. A voltage to frequency converter as set forth in claim 6 wherein said switch control means is operative to actuate said switch means to reconnect said resetting capacitor to said charging means upon the termination of said pulse.

* * * * *